(12) United States Patent
Han

(10) Patent No.: US 10,748,834 B2
(45) Date of Patent: Aug. 18, 2020

(54) STACK TYPE POWER MODULE AND METHOD OF MANUFACTURING THE SAME

(71) Applicants: HYUNDAI MOTOR COMPANY, Seoul (KR); KIA MOTORS CORPORATION, Seoul (KR)

(72) Inventor: Kwang-Joon Han, Seongnam-Si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/179,264

(22) Filed: Nov. 2, 2018

(65) Prior Publication Data

US 2019/0326195 A1 Oct. 24, 2019

(30) Foreign Application Priority Data

Apr. 23, 2018 (KR) .......................... 10-2018-0046840

(51) Int. Cl.
*H01L 23/373* (2006.01)
*H01L 23/495* (2006.01)
(Continued)

(52) U.S. Cl.
CPC ...... *H01L 23/3735* (2013.01); *H01L 21/4825* (2013.01); *H01L 21/4846* (2013.01); *H01L 21/563* (2013.01); *H01L 21/565* (2013.01); *H01L 23/295* (2013.01); *H01L 23/3135* (2013.01); *H01L 23/3142* (2013.01); *H01L 23/3675* (2013.01); *H01L 23/49537* (2013.01); *H01L 23/49562* (2013.01); *H01L 24/05* (2013.01); *H01L 24/32* (2013.01); *H01L 24/33* (2013.01); *H01L 24/83* (2013.01); *H01L 2224/29111* (2013.01); *H01L 2224/29139* (2013.01); *H01L 2224/29147* (2013.01);
(Continued)

(58) Field of Classification Search
CPC . H01L 51/0067; H01L 51/5056; H01L 51/56; H01L 51/0072; H01L 51/0073
USPC ........................................................ 257/139
See application file for complete search history.

(56) References Cited

U.S. PATENT DOCUMENTS

2008/0054425 A1\* 3/2008 Malhan ................... H01L 24/72
257/678
2012/0074552 A1\* 3/2012 Mashimo .............. H01L 21/565
257/676

(Continued)

FOREIGN PATENT DOCUMENTS

KR 10-1321282 B1 10/2013
KR 10-1489325 B1 1/2015

*Primary Examiner* — Andy Huynh
(74) *Attorney, Agent, or Firm* — Morgan, Lewis & Bockius LLP

(57) ABSTRACT

A stack type power module includes: a power semiconductor having a gate and an emitter, each of which has a pad shape, adjacent to each other on one surface of the power semiconductor, and a collector having a pad shape on another surface of the power semiconductor; an upper substrate layer stacked on an upper portion of the power semiconductor, and electrically connected to a metal layer that has a lower surface with which the collector is in contact; and a lower substrate layer stacked on a lower portion of the power semiconductor, and electrically connected to the metal layer that has an upper surface with which each of the gate and the emitter is in contact.

10 Claims, 5 Drawing Sheets

(51) Int. Cl.
*H01L 23/31* (2006.01)
*H01L 23/29* (2006.01)
*H01L 23/00* (2006.01)
*H01L 21/48* (2006.01)
*H01L 21/56* (2006.01)
*H01L 23/367* (2006.01)

(52) U.S. Cl.
CPC ............ *H01L 2224/32225* (2013.01); *H01L 2224/32503* (2013.01); *H01L 2224/33181* (2013.01); *H01L 2224/8384* (2013.01); *H01L 2224/83801* (2013.01); *H01L 2924/13055* (2013.01)

(56) References Cited

U.S. PATENT DOCUMENTS

2013/0270689 A1* 10/2013 Kim .................. H01L 23/49562
　　　　　　　　　　　　　　　　　　　　　257/692
2018/0240731 A1* 8/2018 Choi .................. H01L 23/3677

* cited by examiner

STACK TYPE POWER MODULE AND METHOD OF MANUFACTURING THE SAME

CROSS-REFERENCE(S) TO RELATED APPLICATIONS

This application claims priority to Korean Patent Application No. 10-2018-0046840, filed on Apr. 23, 2018, which is incorporated herein by reference in its entirety.

TECHNICAL FIELD

The present disclosure relates to a stack type power module and a method of manufacturing the same, and more particularly, to a stack type power module and a method of manufacturing the same for securing A structure capable of having high-density and high-integration, and cost competitiveness of thin and light chips.

BACKGROUND

In recent years, with the progress of high-speed, large capacity, and high integration of electronic devices, power devices have been becoming smaller and lighter at lower cost. For this purpose, a method of forming a stack type power module in which a plurality of semiconductor chips are mounted on one semiconductor package has been used.

On the other hand, there is a growing demand for miniaturization and lightening of the power device in an automotive motor. That is, since the automotive motor requires an alternating current (AC) current and the battery is a direct current (DC) power source, an inverter that can convert the DC current of the battery into the AC current is required. In this time, the inverter includes a power module for generating the polarity of the current.

FIG. 1 is a diagram illustrating a general stack type power module.

Referring to FIG. 1, a stack type power module 1 connects a power semiconductor 30 and a lead frame 40 interposed between an upper substrate 10 and a lower substrate 20 to each other through a wire bonding 50.

As described above, the wire bonding 50 is mainly used as an inexpensive and simple connection method, but it is necessary to secure additional space inside the module due to the loop height of the wire.

Accordingly, the stack type power module 1 should have a spacer 60 for securing additional space therein, which is not only difficult to reduce the thickness of the power module 1 but also has the limit raising the cost.

Accordingly, it is necessary for the stack type power module 1 to secure a structure capable of having high density and high integration of thin and light chips, and cost competitiveness as well as securing heat resistance and heat dissipation property.

The contents described in Description of Related Art are to help the understanding of the background of the present disclosure, and can include what is not previously known to those skilled in the art to which the present disclosure pertains.

SUMMARY OF THE DISCLOSURE

An object of the present disclosure is to provide a stack type power module and a method of manufacturing the same for securing the structure capable of having high-density and high-integration of thin and light chips, and cost competitiveness by removing a spacer because a power semiconductor and a lead frame are connected directly through a substrate without interconnecting them via wire bonding.

A stack type power module in accordance with an embodiment of the present disclosure includes: a power semiconductor having a gate and an emitter, each of which having a pad shape, adjacent to each other on one surface of the power semiconductor, and a collector having a pad shape on another surface of the power semiconductor; an upper substrate layer stacked on an upper portion of the power semiconductor, and electrically connected to a metal layer that has a lower surface with which the collector, and a lower substrate layer stacked on a lower portion of the power semiconductor, and electrically connected to the metal layer that has an upper surface with which each of the gate and the emitter is in contact.

Each of the upper substrate layer and the lower substrate layer can be formed with the stacked structure of an upper metal layer, a ceramic layer, and a lower metal layer as the path discharging the heat generated in the power semiconductor to the outside.

At least any one of the lower metal layer of the upper substrate layer and the upper metal layer of the lower substrate layer can be electrically connected with the power semiconductor.

The power semiconductor can be rotated 180° through a flip chip process to be stacked conversely.

The power semiconductor can perform an ON/OFF switching control through the gate, and converts a DC current inputted from the collector into an AC current to output it to the emitter.

An insulating resin can be filled through an underfill process. The insulating resin can be filled into the space between a plurality of terminal pads of the gate and the space between terminal pads between the gate and the emitter.

The insulating resin can be a thermosetting epoxy resin containing silica or silicon dioxide ($SiO_2$) filler.

In the insulating resin, the shape of the filler can be spherical, and the maximum diameter of the filler can be adjusted to be equal to or less than half of the narrowest width of the space to be filled.

In the insulating resin, the content of the filler can be adjusted to 50 weight % or more, based on the total weight of the insulating resin, and the thermal expansion coefficient can be adjusted to 20 (ppm/° C.) or less.

The stack type power module can further include a first lead frame and a second lead frame connected to the metal layer formed on the upper surface of the lower substrate layer, respectively; and the first lead frame can receive a control signal delivered to the gate from the outside, and the second lead frame can receive an AC current delivered to the outside from the emitter.

The stack type power module can further include a molding portion forming an Epoxy Molding Compound (EMC) molding for the power semiconductor, the upper substrate layer, the lower substrate layer, the first lead frame, and the second lead frame.

A method of manufacturing a stack type power module in accordance with another embodiment of the present disclosure includes: printing a circuit pattern for bonding a power semiconductor to an upper surface of a lower substrate layer; bonding a gate and an emitter, each of which has a pad shape, spaced apart from each other on one surface of the power semiconductor through a flip chip process for the power semiconductor to a metal layer attached to the upper surface of the lower substrate layer; filling an insulating resin in a peripheral space of the gate and the emitter through an underfill process; connecting a first lead frame and a second lead frame to the metal layer attached to the upper surface of the lower substrate layer; and bonding a collector having a pad shape on another surface of the power semiconductor to a metal layer attached to a lower surface of an upper substrate layer.

According to an embodiment, the method of manufacturing the stack type power module can further include performing an EMC molding after the bonding of the power semiconductor and the upper substrate layer.

The filling of the insulating resin can be filled in a space between a plurality of terminal pads of the gate, and a space between terminal pads between the gate and the emitter.

The filling of the insulating resin can include filling the insulating resin in a dispensing method using a syringe and then hardening it in a high temperature chamber.

The present disclosure can secure the structure capable of having high-density and high-integration of thin and light chips, and cost competitiveness by removing the spacer because the power semiconductor and the lead frame are connected directly through the substrate without interconnecting them via the wire bonding.

In addition, the present disclosure can eliminate the spacer to reduce the number of processes and parts in the entire manufacturing process, thus enhancing the cost competitiveness.

In addition, the present disclosure can eliminate the spacer to reduce a Z-axis height to reduce the overall size, thus achieving high density.

In addition, the present disclosure can enhance the heat radiation performance through the direct contact between the power semiconductor, the upper substrate layer, and the lower substrate layer.

DETAILED DESCRIPTION OF SPECIFIC EMBODIMENTS

Figure 1:
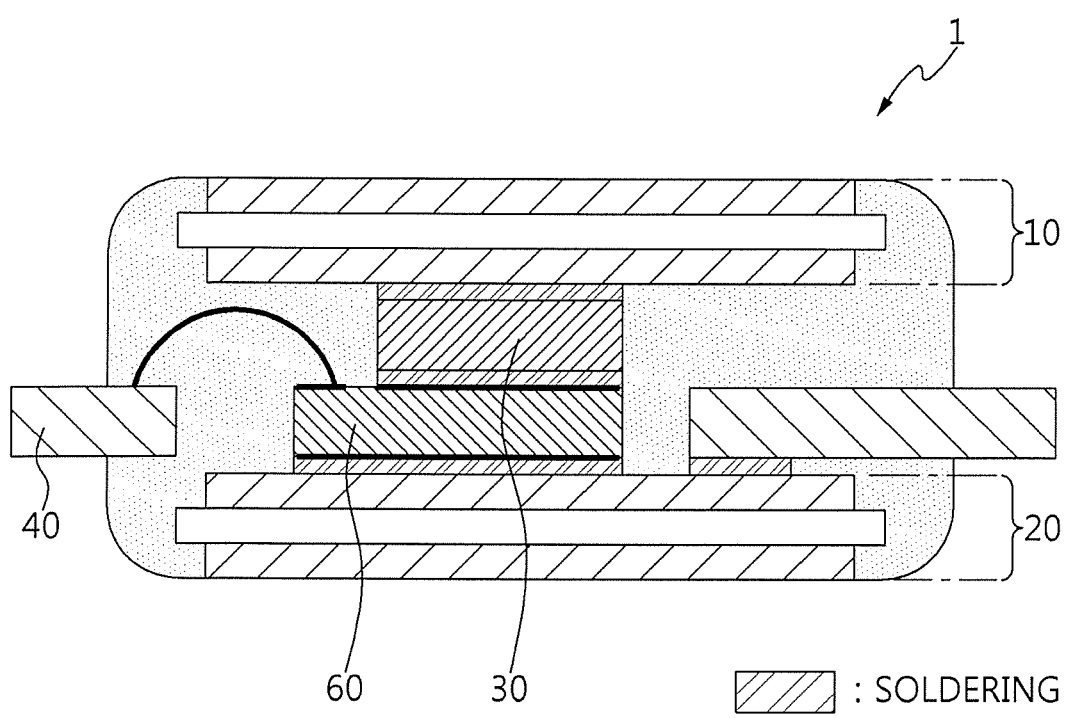
FIG. 1 is a diagram illustrating a general stack type power module.

Hereinafter, exemplary embodiments of the present disclosure will be described in detail with reference to the accompanying drawings. However, in the following description and the accompanying drawings, a detailed description of well-known functions or configurations that can obscure the subject of the present disclosure will be omitted. In addition, it should be noted that the same components are denoted by the same reference numerals as much as possible throughout the entire drawings.

It should be understood that the terms or the words used in the specification and claims hereinafter described should not be construed as limited to general or dictionary meanings, but interpreted based on the meanings and concepts corresponding to technical aspects of the present disclosure on the basis of the principle that the inventor is allowed to define terms appropriately for the best explanation.

Accordingly, the embodiments described in the present specification and the configurations illustrated in the drawings are merely the most preferred one embodiment of the present disclosure, and not intended to represent all of the technical spirits of the present disclosure. Therefore, it should be understood that various equivalents and modifications can be substituted for those at the time of filing the present application.

Some elements are exaggerated, omitted, or schematically illustrated in the accompanying drawings, and actual sizes of respective elements are not necessarily represented in the drawings. The present disclosure is not limited by relative sizes or distances illustrated in the accompanying drawings.

In the entire specification, when a certain portion "includes" a certain component, this means that the other components are excluded, but can be further included unless specially described otherwise. In addition, when a certain portion is "connected" to another portion, it can be "directly connected" or "electrically connected" with other elements interposed therebetween.

The singular forms include the plural forms unless the context clearly indicates otherwise. It will be understood that the terms "comprises" or "includes" specify the presence of features, integers, steps, operations, elements, components, or a combination thereof described in this specification, but do not preclude the presence or addition of one or more other features, integers, steps, operations, elements, components, or a combination thereof.

The term "~unit", as used in the specification, means a software or hardware component, such as FPGA or ASIC, which performs certain tasks. However, "~unit" does not mean to be limited to software or hardware. The term "~unit" can advantageously be configured to reside on the addressable storage medium and configured to execute on one or more processors. Thus, "~unit" can include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and "~units" can be combined into fewer components and "~units" or further separated into additional components and "~units".

Hereinafter, exemplary embodiments of the present disclosure will be described in detail with reference to the accompanying drawings so that those skilled in the art can easily practice the present disclosure. However, the present disclosure can be implemented in various different forms, and is not limited to the exemplary embodiments described herein. In the drawings, in order to clearly describe the present disclosure, portions which are not related to the description of the present disclosure are omitted, and similar portions are denoted by similar reference numerals in the entire specification.

Hereinafter, the exemplary embodiments of the present disclosure will be described with reference to the accompanying drawings.

Figure 2:
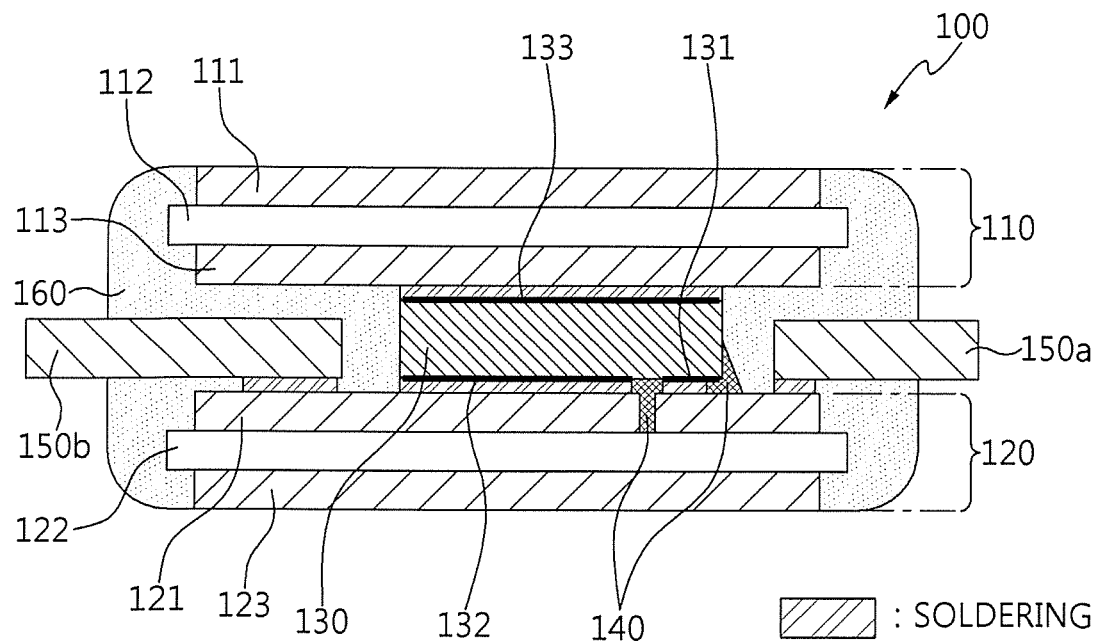
FIG. 2 is a diagram illustrating a stack type power module in accordance with an embodiment of the present disclosure.
Figure 3:
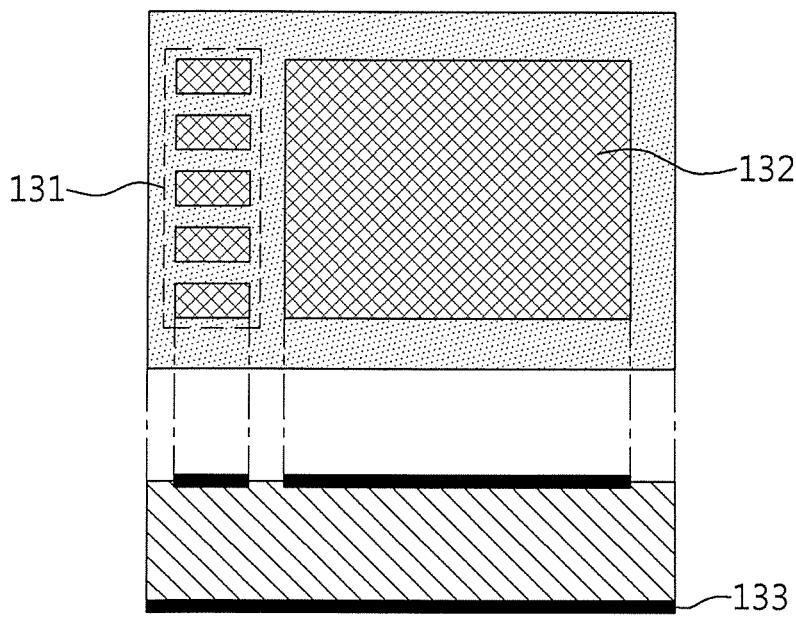
FIG. 3 is a diagram illustrating a pad of a power semiconductor.

FIG. 2 is a diagram illustrating a stack type power module in accordance with an embodiment of the present disclosure, and FIG. 3 is a diagram illustrating a pad of a power semiconductor.

As illustrated in FIG. 2, a stack type power module 100 in accordance with an embodiment of the present disclosure can secure the structure capable of having high-density and high-integration of thin and light chips, and cost competitiveness by removing a spacer because a power semiconductor and a lead frame are connected directly through a substrate without interconnecting them via wire bonding.

For this purpose, the stack type power module 100 directly connects the power semiconductor to the substrate conversely through a flip chip process, thus connecting terminal pads of the power semiconductor and a lead frame through the substrate without the wire bonding.

However, the stack type power module 100 needs to secure the insulation property of the terminal pad of the power semiconductor by directly bonding the terminal pad of the power semiconductor to the substrate.

Accordingly, when bonding the terminal pad of the power semiconductor to the substrate, the stack type power module 100 is filled with an insulating resin through an underfill process in order to secure the insulation property against the terminal pad of the power semiconductor.

Herein, the case where the stack type power module 100 is implemented as a Double Side Cooling (DSC) structure is described, but it is not limited thereto and also applicable to the case implemented as an One Side Cooling structure.

The stack type power module 100 includes an upper substrate layer 110, a lower substrate layer 120, a power semiconductor 130, an insulating resin 140, first and second lead frames 150*a* and 150*b*, and a molding portion 160.

The upper substrate layer 110 and the lower substrate layer 120 are the substrate on which a metal layer is printed on both surfaces of a ceramic layer and have high heat dissipation and high insulation characteristics.

That is, the upper substrate layer 110 is stacked with a first upper metal layer 111, a first ceramic layer 112, and a first lower metal layer 113, and the lower substrate layer 120 is stacked with a second upper metal layer 121, a second ceramic layer 122, and a second lower metal layer 123.

Thus, each of the upper substrate layer 110 and the lower substrate layer 120 has a metal layer formed on both surfaces thereof to form a double-sided cooling structure. That is, the power semiconductor 130 is interposed between the upper substrate layer 110 and the lower substrate layer 120. This can improve heat dissipation performance as the power semiconductor 130 directly contacts with the upper substrate layer 110 and the lower substrate layer 120 by eliminating the existing spacer. Accordingly, the heat generated in the power semiconductor 130 is discharged to the outside through the path connected to the first lower metal layer 113, first ceramic layer 112, and first upper metal layer 111 of the upper substrate layer 110, and can be discharged to the outside through the path connected to the second upper metal layer 121, second ceramic layer 122, and second lower metal layer 123 of the lower substrate layer 120.

Particularly, a circuit pattern for electrical connection with the power semiconductor 130 is printed on at least any one of the first lower metal layer 113 of the upper substrate layer 110 and the second upper metal layer 121 of the lower substrate layer 120, which can be used as an intermediate substrate for bonding the power semiconductor 130 through the flip chip process of the power semiconductor 130.

Herein, the first and second ceramic layers 112 and 122 are insulating materials such as aluminum oxide ($Al_2O_3$) and silicon nitride ($Si_3N_4$), and the first upper metal layer 111, the first lower metal layer 113, the second upper metal layer 121, and the second lower metal layer 123 can be made of copper (Cu), aluminum (Al), or the like.

The upper substrate layer 110 and the lower substrate layer 120 can be formed of various materials and structures such as Thick Film Copper (TFC), PCB, FPCB (Flexible PCB), Insulated Metal Substrate (IMS), Pre-molded Subs, Direct Bonded Copper (DBC), and ceramic.

The power semiconductor 130 can be a large-power and high-speed switching device for converting a DC current into an AC current, for example, an Insulated Gate Bipolar mode Transistor (IGBT) or the like.

In this time, the power semiconductor 130 is rotated by 180° through the flip chip process to be bonded conversely unlike FIG. 1. For example, in FIG. 1, if one surface of the power semiconductor 130 is bonded to the upper substrate layer 110, the same surface of the power semiconductor 130 is bonded to the lower substrate layer 120 in FIG. 2. Thus, the electrical connection relationship through wire bonding in FIG. 1 is formed in the electrical connection relationship through the lower substrate layer 120 in FIG. 2.

The power semiconductor 130, as a terminal for functioning as a switching element, includes a gate 131, an emitter 132, and a collector 133 and these terminals are formed on both surfaces thereof in the pad shape exposed to the outside for the electrical bonding of the upper substrate layer 110 and the lower substrate layer 120.

Referring to FIG. 3, the power semiconductor 130 has the plurality of pad shape gates 131 and the single pad shape emitter 132 located on the same plane as the gate 131 formed one surface thereof, and has the single pad shape collector 133 formed on the other surface thereof.

Specifically, the gate 131 and the emitter 132 are bonded to and electrically connected to the metal layer formed on the upper surface of the lower substrate layer 120, and the collector 133 is bonded to and electrically connected to the metal layer formed on the lower surface of the upper substrate layer.

Herein, all of the upper surface of the lower substrate layer 120 and the lower surface of the upper substrate layer 110 become the surfaces facing the power semiconductor 130. Thus, the power semiconductor 130 performs ON/OFF switching control through the gate 131, and converts a DC current inputted from the collector 133 into an AC current to supply it to the emitter 132.

However, as illustrated in FIG. 3, the gate 131 is formed with a plurality of adjacent pads, and the emitter 132 is formed with a pad adjacent to the same plane as the gate 131.

Thus, since the gate 131 and the emitter 132 are formed adjacent to each other on the same plane of the power semiconductor 130 and are electrically connected to the metal layer formed on the upper surface of the lower substrate layer 120, an underfill process for ensuring insulation is performed. That is, the space between the terminal pads of the gate 131 and the emitter 132 is filled with the insulating resin 140 for ensuring electrical insulation through the underfill process.

The insulating resin 140 is filled in 'the space between the plurality of terminal pads in the gate 131' and 'the space between terminal pads between the gate 131 and the emitter 132'.

The insulating resin 140 is a thermosetting epoxy resin containing silica or silicon dioxide ($SiO_2$) filler. In this time, the insulating resin 140 is filled by a dispensing method using a syringe instead of an injection method, and then cured in a high temperature chamber.

Herein, the shape and size of the filler included in the insulating resin 140 can be adjusted to fill a fine space (gap).

Specifically, the shape of the filler can be a plate-like shape or a spherical shape, but a spherical shape may be used for facilitating fine space penetration. In terms of the size of the filler, a maximum diameter thereof is adjusted to be less than half of the narrowest width of the space to be filled when spherical filler is used. The content of the filler is adjusted to 50 weight % or more, based on the total weight of the insulating resin, and thereby the thermal expansion coefficient is 20 (ppm/° C.) or less.

The first and second lead frames 150a and 150b are bonded to the upper metal layer of the lower substrate layer 120.

The first and second lead frames 150a and 150b connect the power semiconductor 130 to an external circuit to transmit an electric signal. That is, the first lead frame 150a is connected to the metal layer formed on the upper surface of the lower substrate layer 120 to receive a control signal delivered to the gate 131 of the power transistor 130 from the outside. Likewise, the second lead frame 150b is connected to the metal layer formed on the upper surface of the lower substrate layer 120 to receive the AC current delivered to the outside from the emitter 132 of the power semiconductor 130.

The molding portion 160 is formed through an Epoxy Molding Compound (EMC) molding after the power semiconductor 130 is completely packaged as described above. The molding portion 160 seals the packaging structure of the power semiconductor 130 in order to protect the packaging structure of the power semiconductor 130 from external moisture or shock.

The power semiconductor 130 and the first and second lead frames 150a and 150b are stacked with the upper substrate layer 110 or the lower substrate layer 120 through a bonding process. Herein, the bonding process can be, for example, solder/soldering, sinter paste/sintering, Transient Liquid Phase (TLP), or the like.

Specifically, in the solder/soldering, a tin (Sn) based chemical composition is used, and an intermetallic compound is formed on the bonded surface and is bonded.

In the sinter paste/sintering, silver (Ag) based sinter paste/sintering and copper (Cu) based sintering can be used. Specifically, silver-based sinter paste/sintering bonds by making silver powder particles into paste form and sintering them at high temperature. The pressure can be atmospheric pressure or high pressure. Copper-based sinter paste/sintering bonds by making copper powder particles into paste form and sintering at high temperature/high pressure. Herein, the filler can be copper (Cu), copper oxide ($CuO_2$), copper-tin (Cu—Sn), or the like.

TLP is a liquid-phase transition diffusion bonding process in which copper (Cu) and tin (Sn) are formed of an intermetallic compound of 100%. TLP is similar to the soldering, but the process time is longer than 1 hour.

Figure 4:
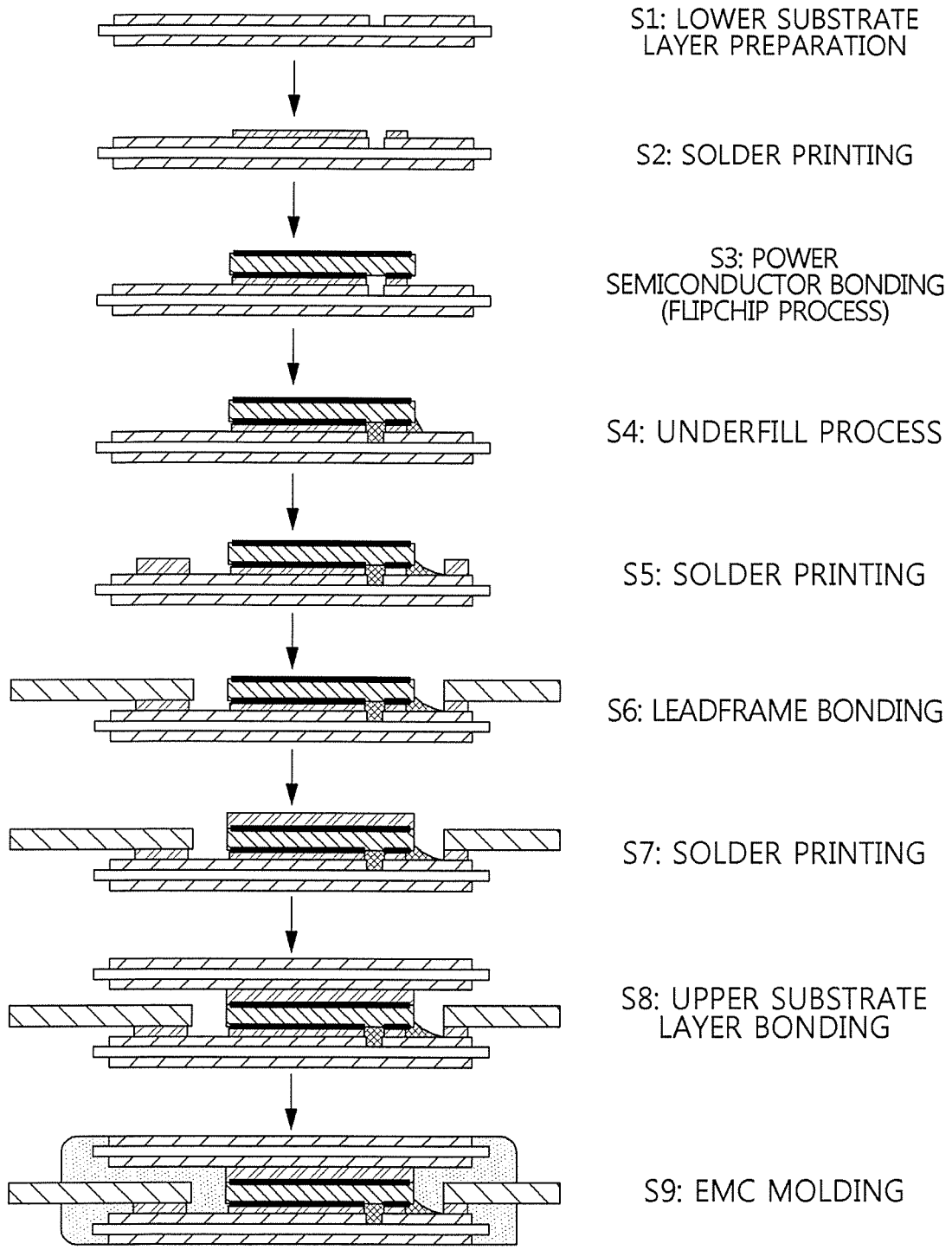
FIG. 4 is a diagram illustrating a method of manufacturing the stack type power module in accordance with the embodiment of the present disclosure.
Figure 5:
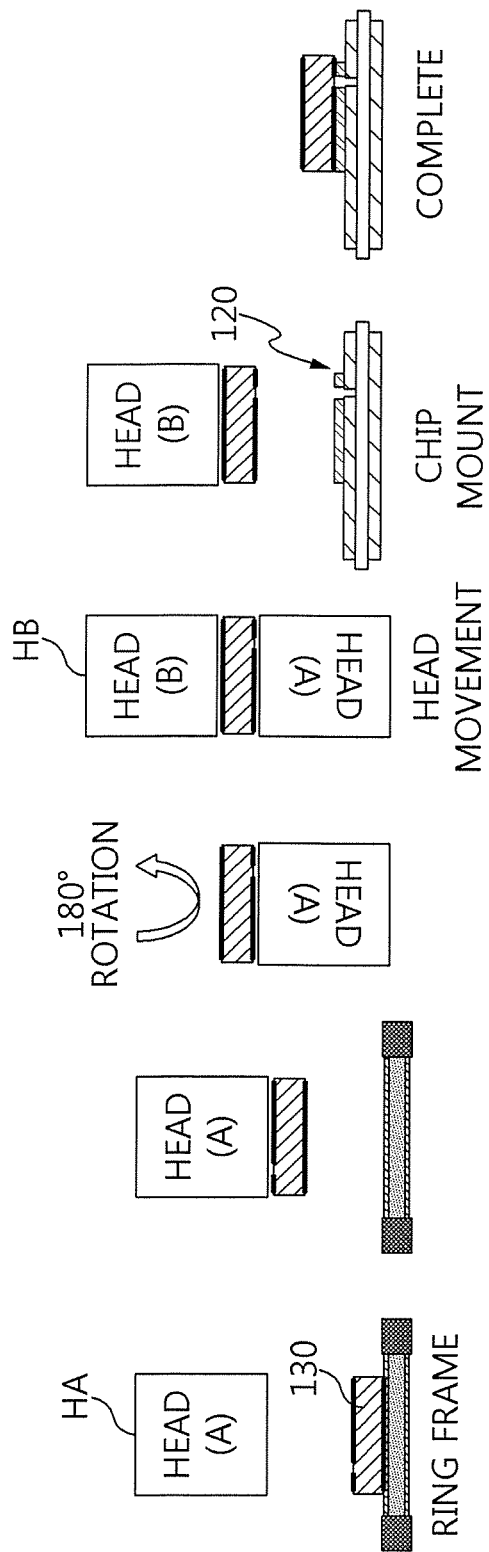
FIG. 5 is a diagram explaining a flip chip process in FIG. 4.
Figure 6:
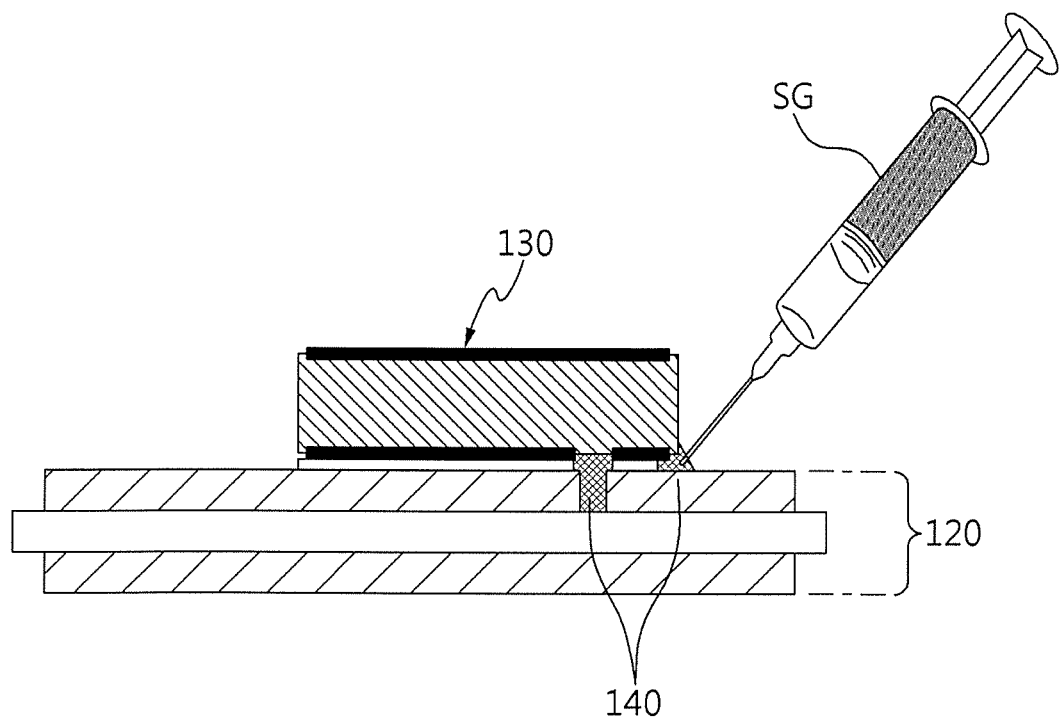
FIG. 6 is a diagram explaining an underfill process in FIG. 4.

FIG. 4 is a diagram illustrating a method for manufacturing a stack type power module in accordance with the embodiment of the present disclosure, FIG. 5 is a diagram explaining a flip chip process in FIG. 4, and FIG. 6 is a diagram explaining an underfill process in FIG. 4.

Referring to FIG. 4, in S1, the lower substrate layer 120 is formed. Herein, a circuit pattern for bonding with the power semiconductor 130 is printed on the upper surface of the lower substrate layer 120.

Then, in S2 and S3, the power semiconductor 130 is deposited on the lower substrate layer 120 through the solder printing. Herein, the power semiconductor 130 is rotated by 180° through the flip chip process to be bonded to the lower substrate layer 120 conversely. In this time, the gate 131 and emitter 132 of the power semiconductor 130 are bonded to the lower substrate layer 120. On the other hand, conventionally, the collector 133 of the power semiconductor 130 is bonded on the lower substrate layer 120.

Herein, if the flip chip process can be carried out while being in an inverted state when receiving the power semiconductor 130, it is possible to mount the chip with the mount equipment without special equipment. If it is necessary to rotate the power semiconductor 130 by 180°, the chip mounting is performed using two heads (head A and head B) as illustrated in FIG. 5. That is, the power semiconductor 130 located on the ring frame is rotated by 180° by the head A (HA), and the power semiconductor 130 rotated by 180° moves from the head A (HA) to the head B (HB), and then mounted on the lower substrate layer 120.

Then, in S4, in order to secure the insulation property of the terminal pad against the gate 131 and emitter 132 of the power semiconductor 130 as the power semiconductor 130 is bonded to the lower substrate layer 120 through the flip chip process, the underfill process is performed. That is, the space formed between the terminal pads of the gate 131 and the emitter 132 is filled with the insulating resin 140.

Herein, in the underfill process, the insulating resin 140 is discharged using the syringe SG as illustrated in FIG. 6 to be filled in the space formed in the terminal pad.

Then, in S5 and S6, the first and second lead frames 150a and 150b are stacked on the lower substrate layer 120 through the solder printing.

The first lead frame 150a is connected with the gate 131 of the power semiconductor 130 through the circuit pattern printed on the upper surface of the lower substrate layer 120 instead of being connected with the gate 131 of the power semiconductor 130 through the wire bonding. If the first lead frame 150a is connected with the gate 131 of the power semiconductor 130 through the wire bonding, a spacer is required, but herein, since the spacer is eliminated, the height in the Z-axis direction can be reduced.

Then, in S7 and S8, the upper substrate layer 110 is stacked on the collector 133 of the power semiconductor 130 through the solder printing.

However, if the first lead frame 150a is connected with the gate 131 of the power semiconductor 130 through the wire bonding, the bonding the spacer to the upper substrate layer 110 is further required. That is, as the spacer is eliminated, the upper substrate layer 110 does not require performing the upper package to bond the spacer.

Then, in S9, the packaging is completed as a final module through the EMC molding.

As described above, the method of manufacturing the stack type power module in accordance with the embodiment of the present invention excludes the inserting the spacer because the power semiconductor 130 and the first lead frame 150a are not connected by the wire bonding, such that some of the overall manufacturing processes can be excluded. This can reduce the manufacturing processes and the number of parts, thereby contributing to improve the cost competitiveness, and additionally, reduce the height in the Z-axis direction by eliminating the spacer, thus expecting high density due to the size reduction.

The method in accordance with some embodiments can be implemented in the form of program instructions that can be executed through various computer means to be recorded on a computer readable medium. The computer-readable medium can include program instruction, data file, data structure, and the like, alone or in combination thereof. The program instruction recorded on the medium can be those specially designed and constructed for the present disclosure, or can be available to those skilled in the art of computer software. Examples of a computer-readable media include magnetic media such as a hard disk, a floppy disk, and a magnetic tape, optical media such as CDROM and DVD, magneto-optical media such as a floptical disk, magneto-optical media such a floptical disk, and a hardware device specifically configured to store and execute program instructions such as ROM, RAM, and flash memory. Examples of the program instruction include machine language code such as those generated by a compiler, as well as high-level language code that can be executed by a computer using an interpreter or the like.

Although the present disclosure has been described with a focus on novel features of the present disclosure applied to various embodiments, it will be apparent to those skilled in the art that various deletions, substitutions, and changes in the form and details of the apparatus and method described above may be made without departing from the scope of the present disclosure. Accordingly, the scope of the present disclosure is defined by the appended claims rather than by the foregoing description. All modifications within the equivalent scope of the appended claims are embraced within the scope of the present disclosure.

What is claimed is:

1. A stack type power module, comprising:
    a power semiconductor having:
        a gate and an emitter, each of which has a pad shape, adjacent to each other on one surface of the power semiconductor; and
        a collector having a pad shape formed on another surface of the power semiconductor;
    an upper substrate layer stacked on an upper portion of the power semiconductor, and electrically connected to a lower metal layer that has a lower surface with which the collector is in contact;
    a lower substrate layer stacked on a lower portion of the power semiconductor, and electrically connected to an upper metal layer that has an upper surface with which each of the gate and the emitter is in contact; and
    a first lead frame and a second lead frame, which are connected to the upper metal layer, disposed on the upper surface of the lower substrate layer,
    wherein the first lead frame receives a control signal delivered to the gate from outside, and the second lead frame receives an alternating current (AC) delivered to outside from the emitter, and
    wherein the gate is directly connected to the first lead frame through the upper metal layer of the lower substrate layer.

2. The stack type power module of claim 1,
    wherein each of the upper substrate layer and the lower substrate layer has a stacked structure of an upper metal layer, a ceramic layer, and a lower metal layer as a path for discharging heat generated in the power semiconductor to outside.

3. The stack type power module of claim 2,
    wherein at least any one of the lower metal layer of the upper substrate layer or the upper metal layer of the lower substrate layer is electrically connected with the power semiconductor.

4. The stack type power module of claim 1,
    wherein the power semiconductor is bonded to the upper surface of the lower substrate layer.

5. The stack type power module of claim 1,
    wherein the power semiconductor performs an ON/OFF switching control through the gate, and converts a direct current (DC) inputted from the collector into an alternating current (AC) to output to the emitter.

6. The stack type power module of claim 1,
    wherein an underfill insulating resin is filled in a space between a plurality of terminal pads of the gate and a space between terminal pads between the gate and the emitter.

7. The stack type power module of claim 1,
    wherein the insulating resin is a thermosetting epoxy resin containing silica or silicon dioxide (SiO2) filler.

8. The stack type power module of claim 7,
    wherein the filler of the insulating resin has a spherical shape and has a maximum diameter to be equal to or less than half of a narrowest width of a space between a plurality of terminal pads of the gate and a space between terminal pads between the gate and the emitter to be filled.

9. The stack type power module of claim 8,
    wherein the filler has an content of 50 weight % or more, based on the total weight of the insulating resin, and a thermal expansion coefficient of 20 ppm/° C. or less.

10. The stack type power module of claim 1, further comprising a molding portion, which includes an epoxy molding compound (EMC), for the power semiconductor, the upper substrate layer, the lower substrate layer, the first lead frame, and the second lead frame.

* * * * *